(12) United States Patent
Wang et al.

(10) Patent No.: US 9,980,401 B1
(45) Date of Patent: May 22, 2018

(54) LOCKING APPARATUS AND ELECTRONIC DEVICE HAVING SAME

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Wen-Jie Wang, Shenzhen (CN); Xin Yang, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days. days.

(21) Appl. No.: 15/618,262

(22) Filed: Jun. 9, 2017

(30) Foreign Application Priority Data

Mar. 14, 2017 (CN) .......................... 2017 1 0150170

(51) Int. Cl.
| | |
|---|---|
| *G06F 1/16* | (2006.01) |
| *H05K 5/00* | (2006.01) |
| *H05K 7/00* | (2006.01) |
| *H05K 5/02* | (2006.01) |
| *E05B 65/00* | (2006.01) |
| *E05C 3/12* | (2006.01) |
| *E05B 47/00* | (2006.01) |

(52) U.S. Cl.
CPC ....... *H05K 5/0221* (2013.01); *E05B 47/0002* (2013.01); *E05B 65/0067* (2013.01); *E05C 3/12* (2013.01)

(58) Field of Classification Search
CPC .. G06F 1/1679; H05K 5/0221; H05K 5/0217; E05B 47/0002; E05B 65/0067

USPC ............. 361/679.26–679.3, 679.55, 679.56, 361/679.57, 679.58
See application file for complete search history.

(56) References Cited

U.S. PATENT DOCUMENTS

| 8,279,592 B2* | 10/2012 | Imamura ............... G06F 1/1616 361/679.02 |
|---|---|---|
| 8,596,412 B1* | 12/2013 | Jorgensen ............ G06F 1/1626 181/202 |
| 2011/0156549 A1* | 6/2011 | Zhang ...................... H05K 5/02 312/223.1 |
| 2013/0077221 A1* | 3/2013 | Becze ................... G06F 3/1438 361/679.3 |

(Continued)

*Primary Examiner* — Anthony Haughton
(74) *Attorney, Agent, or Firm* — ScienBiziP, P.C.

(57) ABSTRACT

A locking apparatus for an enclosed electronic device locking or releasing a latching member includes a rotating assembly, a sliding member defining a notch, an elastic member, and an electromagnet. The rotating assembly comprises two brackets and a rotating member. The rotating member comprises an opening. Opposite sides of the opening define a pulling portion and a resisting portion. Opposite ends of the elastic member connect to the pulling portion and the sliding member. The latching member resists against the resisting portion to rotate the rotating member. The sliding member moves to the latching member by the elastic member to make the notch engage with the latching member. The notch is removed from the latching member by the electromagnet, the sliding member pulls the elastic member to rotate the rotating member. The resisting portion resists against the latching member to remove the latching member from the sliding member.

16 Claims, 5 Drawing Sheets

(56) References Cited

U.S. PATENT DOCUMENTS

| | | | | |
|---|---|---|---|---|
| 2015/0212552 A1* | 7/2015 | Shin | .................... | G06F 1/1675 |
| | | | | 361/679.26 |
| 2016/0091931 A1* | 3/2016 | Montevirgen | ......... | A45C 11/00 |
| | | | | 361/679.55 |

* cited by examiner

LOCKING APPARATUS AND ELECTRONIC DEVICE HAVING SAME

FIELD

The subject matter herein generally relates to locking apparatus and electronic devices having same.

BACKGROUND

An electronic device such as a mobile phone, a laptop, or a pad has an upper housing and a lower housing. The lower housing can be coupled to the upper housing by a plurality of screws or a plurality of latching hooks. However, the lower housing has a plurality of holes for receiving the screws, which affects an exterior aesthetic quality of the electronic device. Meanwhile, it is necessary to use tools for removing and installing the screws. In addition, the latching hooks can be easily damaged in process of assembling or disassembling the electronic device. It is time-consuming and also needs to use external force to disassemble the electronic device. Improvements in the art is preferred.

BRIEF DESCRIPTION OF THE DRAWINGS

Implementations of the present technology will now be described, by way of example only, with reference to the attached figures.

DETAILED DESCRIPTION

Figure 1:
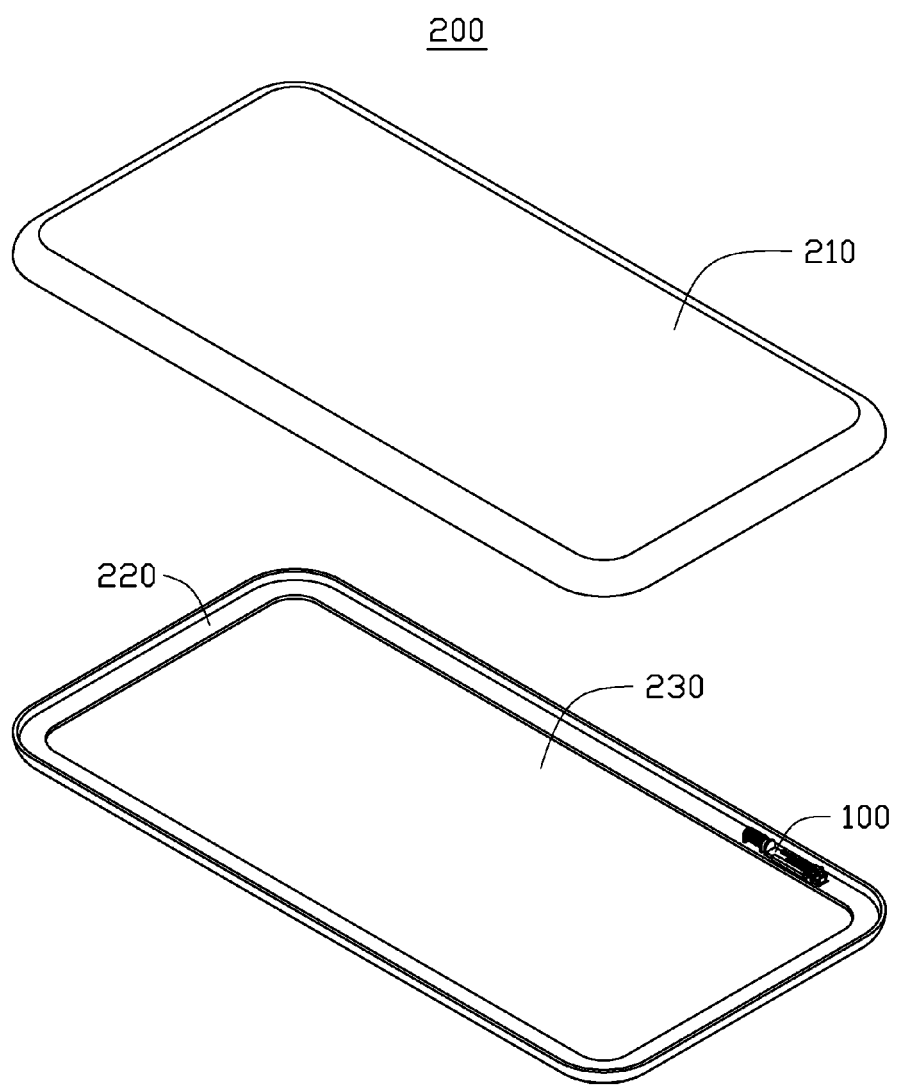
FIG. 1 is an exploded view of an exemplary embodiment of a portion of an electronic device, and the electronic device includes a locking apparatus.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean at least one. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to", it specifically indicates open-ended inclusion or membership in the so-described combination, group, series, and the like.

The present disclosure is described in relation to an electronic device and a physical locking apparatus.

Figure 2:
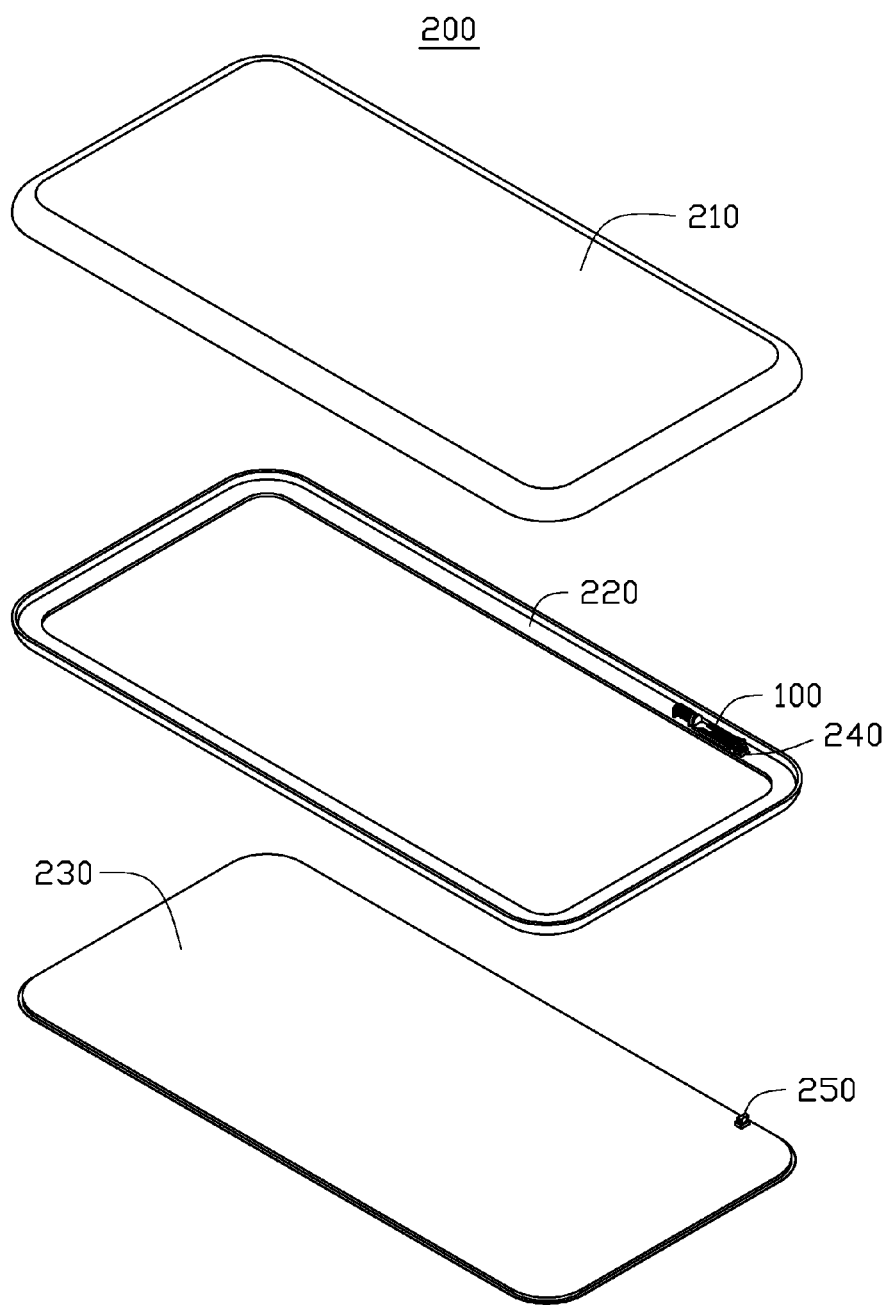
FIG. 2 is an exploded view of the electronic device of FIG. 1.
Figure 3:
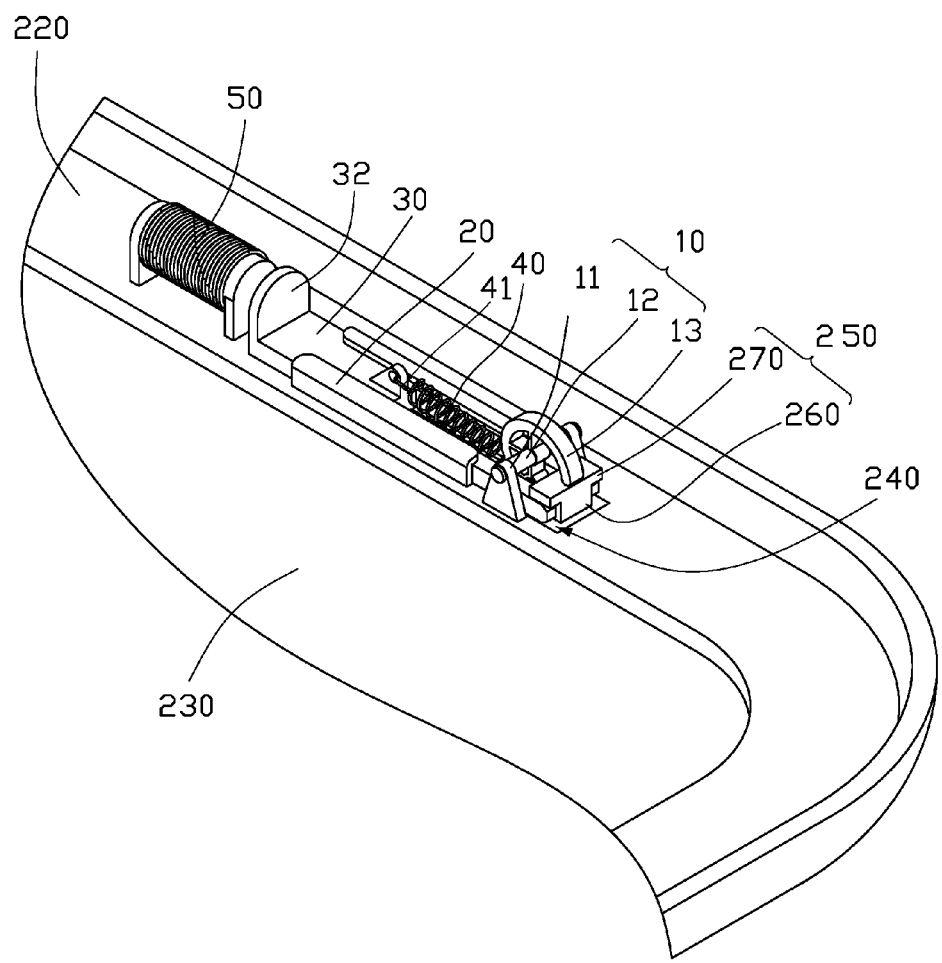
FIG. 3 is an enlarged view of a portion of the electronic device, including a middle frame and a second housing illustrated in FIG. 2.

FIG. 1 illustrates an exemplary embodiment of a locking apparatus 100 and an electronic device 200. The locking apparatus 100 can be mounted in the electronic device 200. The electronic device 200 can include a first housing 210, a middle frame 220, and a second housing 230. The middle frame 220 can be positioned on the first housing 210. Referring to FIG. 2, at least one installing holes 240 can be defined in the middle frame 220. The second housing 230 can include at least one latching member 250. The at least one latching member 250 can be adjacent to an edge of the second housing 230. The second housing 230 can be positioned on the middle frame 220. Each latching member 250 can detachably engage with one corresponding installing hole 240. Referring to FIG. 3, the latching member 250 can be substantially T-shaped. The latching member 250 can include a fastening portion 260 and a restriction portion 270 positioned on the fastening portion 260. The fastening portion 260 can be positioned on the second housing 230. In the illustrated exemplary embodiment, the number of locking apparatus 100, the number of installing holes 240, and the number of latching members 250 can each be one. In at least one exemplary embodiment, the electronic device 200 can further include other functional components which are not described.

FIG. 3 shows that the locking apparatus 100 can be positioned on the middle frame 220. The locking apparatus 100 can include a rotating assembly 10, a guiding member 20, a sliding member 30, an elastic member 40, and an electromagnet 50. The rotating assembly 10 can include two brackets 11, a pivot 12, and a rotating member 13. The two brackets 10 can be positioned on the middle frame 220 and be adjacent to the installing hole 240. The pivot 12 can be coupled between the two brackets 11. The rotating member 13 can be rotatably coupled to the pivot 12. The rotating member 13 can rotate about an axis of the pivot 12.

Figure 4:
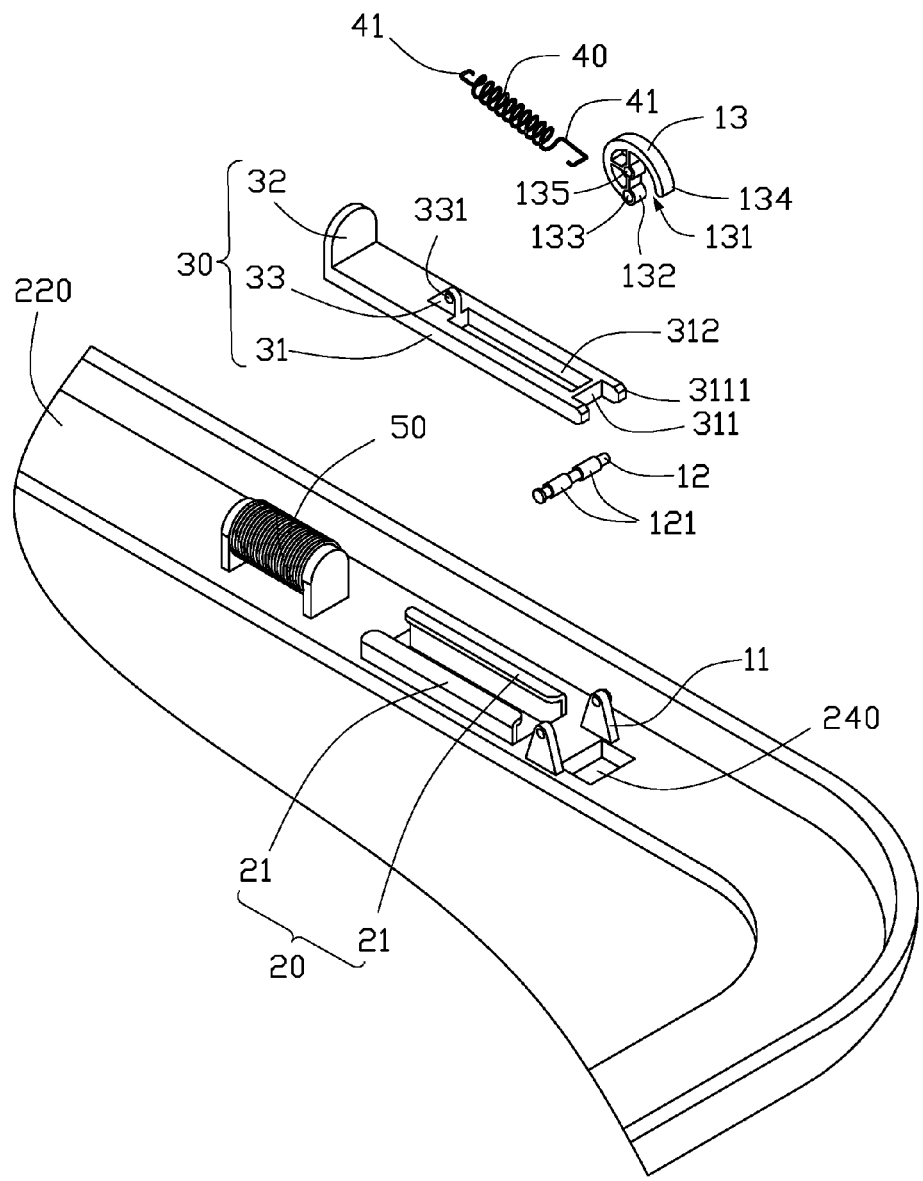
FIG. 4 is an exploded view of the locking apparatus illustrated in FIG. 3.

In the illustrated exemplary embodiment, referring to FIG. 4, the rotating assembly 10 can further include two stopping sleeves 121. The two stopping sleeves 121 can wrap around the pivot 12. The two stopping sleeves 121 can be located on two sides of the rotating member 13, to limit the movement of the rotating member 13.

Referring to FIG. 4, the rotating member 13 can be substantially circular. The rotating member 13 can include an opening 131. A pulling portion 132 can be formed on one side of the opening 131. A resisting portion 134 can be formed on the other side of the opening 131 opposite to the pulling portion 132. A connecting hole 133 can be defined in the pulling portion 132. Referring to FIGS. 3 and 4, the connecting hole 133 can connect the elastic member 40. The resisting portion 134 can resist against the restriction portion 270 of the latching member 250 to push the latching member 250 out of the installing hole 240. A pivotal hole 135 can be defined in the rotating member 13 for allowing the pivot 12 to pass through.

Referring to FIG. 4, the guiding member 20 can be positioned on the middle frame 220. The guiding member 20 can be adjacent to the two brackets 11. The guiding member 20 can guide the movement of the sliding member 30. In the illustrated exemplary embodiment, the guiding member 20 can include two parallel guiding portions 21. The two guiding portions 21 can be spaced from each other. Each guiding portion 21 can be substantially L-shaped.

Referring to FIG. 3, the sliding member 30 can slide between the two guiding portions 21. Referring to FIGS. 3 and 4, the sliding member 30 can include a main body 31, an attracting portion 32, and a connecting portion 33. The main body 31 can be substantially a strip. A notch 311 can be defined in an end of the main body 31 adjacent to the two brackets 11 and can receive the fastening 260 of the latching member 250. The notch 311 can include two edges 3111. A receiving hole 312 can be defined in the main body 31 and be adjacent to the notch 311. The receiving hole 312 can partially receive the pulling portion 132 and the elastic member 40. In the illustrated exemplary embodiment, the receiving hole 312 can be a strip-shaped hole.

Referring to FIG. 4, the attracting portion 32 can be positioned on another end of the main body 31 opposite to the notch 311. The attracting portion 32 can perpendicularly extend from an end of the main body 31. In the illustrated exemplary embodiment, the attracting portion 32 can be made from magnetic materials.

The connecting portion 33 can be positioned on the main body 31. The connecting portion 33 can be located between the receiving hole 312 and the attracting portion 32. In the illustrated exemplary embodiment, a connecting hole 331 can be defined in the connecting portion 33 for connecting the connecting portion 33 to the elastic member 40. In at least one exemplary embodiment, a groove (not shown in FIG. 4) can be defined in the connecting portion 33 to replace the connecting hole 331.

Referring to FIG. 3 and FIG. 4, the elastic member 40 can be connected to the pulling portion 132 of the rotating member 13 and to the connecting portion 33 of the sliding member 30. In the illustrated exemplary embodiment, the elastic member 40 can include two connecting hooks 41. The two connecting hooks 41 can engage with the connecting hole 133 of the pulling member 132 and with the connecting hole 331 of the connecting portion 33.

The electromagnet 50 can be positioned on the middle frame 220. The electromagnet 50 can be adjacent to an end of guiding member 20 far away from the two brackets 11. The electromagnet 50 can attract the attracting portion 32 of the sliding member 30 to move the sliding member 30 along the guiding member 20 when the electromagnet 50 is powered.

In the assembly of the locking apparatus 100, the two brackets 11 of each locking apparatus 100 can be positioned to the middle frame 220 adjacent to the installing hole 240, and the pivot 12 can engage with the pivotal hole 135 of the rotating member 13. The two stopping sleeves 121 can wrap around the pivot 12 and be located on two sides of the rotating member 13. The guiding member 21 can be positioned on the middle frame 220 and can be adjacent to the two brackets 11. The sliding member 30 can slide between the two guiding portion 21 of the guiding member 20. The two connecting hooks 41 of the elastic member 40 can engage with the connecting hole 133 of the pulling member 132 and the connecting hole 331 of the connecting portion 33. The electromagnet 50 can be positioned on the middle frame 220 and can be adjacent to an end of guiding member 20 far away from the two brackets 11.

When the electronic device 200 is assembled, the electromagnet 50 is not powered. The second housing 230 can cover the middle frame 220, and the at least one latching member 250 can pass through the corresponding installing hole 240. The restriction portion 270 of the latching member 250 can resist against the resisting portion 134 of the rotating member 13 by pressing the second housing 230. The rotating member 13 can rotate around the pivot 12 by the restriction portion 270 resisting against the resisting portion 134, and the pulling portion 132 can move far away from the sliding member 30. Thus the pulling portion 132 can pull the sliding member 30 to the latching member 250 by the elastic member 40 until the two edges 3111 of the notch 311 resist against the restriction 270 of the latching member 250. The second housing 230 is persistently pressed, thus the restriction 270 deviates from the two edges 3111. An elastic force of the elastic member 40 can accordingly cause the pulling portion 132 to continuously pull the sliding member 30 to move towards to the latching member 250, until the fastening portion 260 of the latching member 250 engages with the notch 311. Simultaneously, the sliding member 30 can lock the latching member 250 of the electronic device 200.

Figure 5:
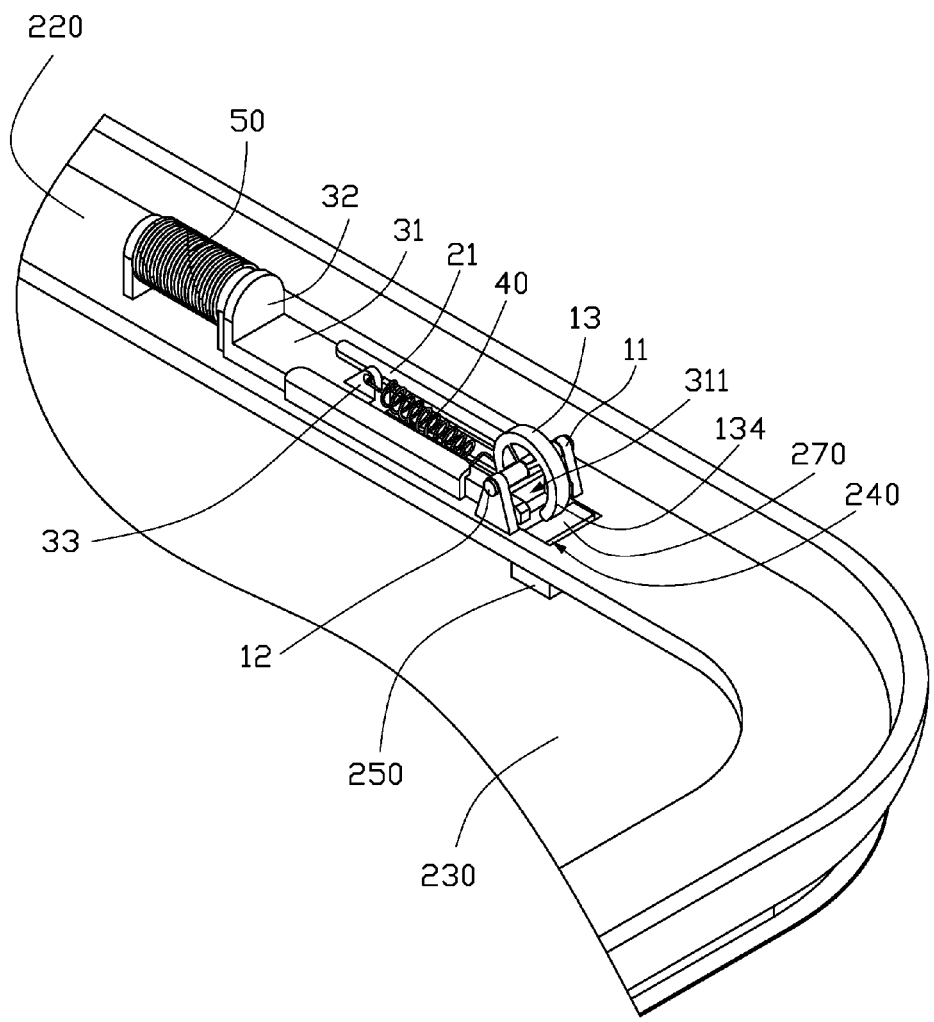
FIG. 5 is an enlarged view of a portion of the electronic device, the middle frame and the second housing of FIG. 3 in releasing state.

Referring to FIG. 5, when the electronic device 200 is to be disassembled, power of the electromagnet 50 is turned on. The electromagnet 50 attracts the absorbing portion of the sliding member 30 which causes the sliding member 30 to move far away from the latching member 250. The notch 311 deviates from the fastening portion 260 of the latching member 250. Simultaneously, the connecting portion 33 of the sliding member 30 can pull the pulling portion 132 of the rotating member 13 to rotate the rotating member 13 by the elastic member 40. The resisting portion 134 can resist against the restriction portion 270 of the latching member 250 by the rotating member 13. When the notch 311 deviates from the fastening portion 260 of the latching member 250, the resisting portion 134 can resist against the restriction portion 270 to remove the latching member 250 from the installing hole 240. Simultaneously, the second housing 230 can automatically deviate from the middle frame 220.

In at least one exemplary embodiment, the guiding member 20 can be removed, and the sliding member 30 can directly slidable on the middle frame 220.

In at least one exemplary embodiment, the pivot 12 and the pivotal hole 135 can be removed, and the rotating member 13 can directly couple to and rotate with the two brackets 11.

In at least one exemplary embodiment, the attracting portion 32 can be removed, and an end of the main body 31 far away from the connecting portion 33 can be attracted by the electromagnet 50.

In at least one exemplary embodiment, the receiving hole 312 can be removed, and the elastic member 40 can still pull the sliding member 30.

As described above, the latching member 250 can resist against the resisting portion 134 of the rotating member 13 to rotate the rotating member 13. The rotating member 13 can move the sliding member 30 to the latching member 250 by the elastic member 40. Thus, the latching member 250 can engage with the notch 311 of the sliding member 30 to lock the latching member 250. In addition, the notch 311 can deviate from the latching member 250 when the electromagnet 50 attracts the sliding member 30. The sliding member 30 can pull the elastic member 40 to rotate the rotating member 13. Thus, the resisting portion 134 can resist against the latching member 250 to make the latching member 250 deviate from the sliding member 30. Thereby, the second housing 230 of the electronic device 200 can be conveniently assembled and disassembled by the locking apparatus 100.

The exemplary embodiments shown and described above are only examples. Many details are often found in the art such as the other features of a locking apparatus and an electronic device having same. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A locking apparatus for locking or releasing a latching member of an electronic device, the locking apparatus comprising:
   a rotating assembly comprising two brackets on the electronic device and a rotating member rotatably coupled to the two brackets; the rotating member comprising an opening; opposite sides of the opening defining a pulling portion and a resisting portion;
   a sliding member slidable on the electronic device and adjacent to the two brackets, and one end of the sliding member defining a notch to engage with the latching member;
   an elastic member, the elastic member coupled to the pulling portion and the sliding member;
   an electromagnet on the electronic device for attracting the sliding member to move the sliding member; and,
   wherein the latching member resists against the resisting portion to rotate the rotating member, the sliding member moves towards to the latching member by the pulling portion pulling the elastic member, and the notch thereby engages with the latching member;
   wherein the notch deviates from the latching member by the electromagnet attracting the sliding member, the sliding member pulls the elastic member to rotate the rotating member, and the resisting portion resists against the latching member to remove the latching member from the sliding member.

2. The locking apparatus of claim 1, wherein the rotating assembly further comprises a pivot; a pivotal hole is defined in the rotating member, and the pivot engages with the pivotal hole.

3. The locking apparatus of claim 2, wherein the rotating assembly further comprises two stopping sleeves; the two stopping sleeves wrap around the pivot, and the two stopping sleeves are on two sides of the rotating member to limit movement of the rotating member along the pivot.

4. The locking apparatus of claim 1, wherein the sliding member comprises a main body, an attracting portion, and a connecting portion; the notch is defined in an end of the main body adjacent to the two brackets, the attracting portion is positioned on an end of the main body away from the notch, the electromagnet can attract the attracting portion, and the connecting portion is on the main body to connect an end of the elastic member.

5. The locking apparatus of claim 4, wherein the attracting portion perpendicularly extends from the end of the main body away from the notch.

6. The locking apparatus of claim 4, wherein a receiving hole is defined in the main body, and the receiving hole partially receives the pulling portion and partially receives the elastic member.

7. The locking apparatus of claim 4, wherein a connecting hole is defined in the pulling portion, a connecting hole is defined in the connecting portion, the elastic member comprises two connecting hooks, and the two connecting hooks engage with the connecting hole of the pulling member and with the connecting hole of the connecting portion.

8. The locking apparatus of claim 4, wherein the locking apparatus further comprises a guiding member comprising two parallel guiding portions; the two guiding portions are spaced from each other, each guiding portion is substantially L-shaped, and the sliding member is slidable between the two guiding portions.

9. An electronic device comprising:
   a first housing;
   a middle frame on the first housing and defining the at least one installing holes;
   a second housing comprising at least one latching member, each latching member detachably engaging with the corresponding installing hole;
   at least one locking apparatus on the middle frame, each locking apparatus comprising:
   a rotating assembly comprising two brackets on the middle frame and a rotating member rotatably positioned on the two brackets, the rotating member comprising an opening, opposite sides of the opening defining a pulling portion and a resisting portion;
   a sliding member slidable on the middle frame and disposed adjacent to the two brackets, and one end of the sliding member defining a notch to engage with the latching member;
   an elastic member, the elastic member coupled to the pulling portion and the sliding member;
   an electromagnet on the middle frame for attracting the sliding member to move the sliding member; and,
   wherein, the latching member resists against the resisting portion to rotate the rotating member, and the sliding member moves towards to the latching member by the pulling portion pulling the elastic member, the notch thereby engages with the latching member;
   wherein, the notch deviates from the latching member by the electromagnet attracting the sliding member, the sliding member pulls the elastic member to rotate the rotating member, the resisting portion resists against the latching member to remove the latching member from the instilling hole.

10. The electronic device of claim 9, wherein the rotating assembly further comprises a pivot; a pivotal hole is defined in the rotating member, and the pivot engages with the pivotal hole.

11. The electronic device of claim 10, wherein the rotating assembly further comprises two stopping sleeves; the two stopping sleeves wrap around the pivot, and the two stopping sleeves are on two sides of the rotating member to limit movement of the rotating member along the pivot.

12. The electronic device of claim 9, wherein the sliding member comprises a main body, an attracting portion, and a connecting portion; the notch is defined in an end of the main body adjacent to the two brackets, the attracting portion is positioned on another end of the main body opposite to the notch, the electromagnet can attract the attracting portion, and the connecting portion is on the main body to connect an end of the elastic member.

13. The electronic device of claim 12, wherein the attracting portion perpendicularly extends from the end of the main body far away from the notch.

14. The electronic device of claim 12, wherein a receiving hole is defined in the main body and adjacent to the notch, and the receiving hole partially receives the pulling portion and receives the elastic member.

15. The electronic device of claim 12, wherein a connecting hole is defined in the pulling portion, a connecting hole is defined in the connecting portion, the elastic member comprises two connecting hooks, and the two connecting hooks engage with the connecting hole of the pulling member and with the connecting hole of the connecting portion.

16. The electronic device of claim 12, wherein the locking apparatus further comprises a guiding member comprising two parallel guiding portions; the two guiding portions are spaced from each other, each guiding portion is substantially L-shaped, and the sliding member slide between the two guiding portion.

\* \* \* \* \*